United States Patent
Ando et al.

(10) Patent No.: US 10,290,700 B2
(45) Date of Patent: May 14, 2019

(54) MULTILAYER DIELECTRIC FOR METAL-INSULATOR-METAL CAPACITOR (MIMCAP) CAPACITANCE AND LEAKAGE IMPROVEMENT

(71) Applicant: INTERNATIONAL BUSINESS MACHINES CORPORATION, Armonk, NY (US)

(72) Inventors: Takashi Ando, Tuckahoe, NY (US); Eduard A. Cartier, New York, NY (US); Hemanth Jagannathan, Niskayuna, NY (US); Paul C. Jamison, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/706,126

(22) Filed: Sep. 15, 2017

(65) Prior Publication Data
US 2018/0240863 A1 Aug. 23, 2018

Related U.S. Application Data

(62) Division of application No. 15/440,939, filed on Feb. 23, 2017.

(51) Int. Cl.
*H01L 21/768* (2006.01)
*H01L 49/02* (2006.01)
(Continued)

(52) U.S. Cl.
CPC ........ *H01L 28/60* (2013.01); *H01L 21/02178* (2013.01); *H01L 21/02189* (2013.01); *H01L 21/32051* (2013.01)

(58) Field of Classification Search
CPC ............... H01L 28/60; H01L 21/02178; H01L 21/02189; H01L 21/32051
See application file for complete search history.

(56) References Cited

U.S. PATENT DOCUMENTS 7,491,654 B2    2/2009  Song et al.
7,700,988 B2    4/2010  Lin et al.
(Continued)

FOREIGN PATENT DOCUMENTS

CN    104241245    12/2014
KR    2003-0092522    12/2003
(Continued)

OTHER PUBLICATIONS

Kwon, et al., "A Correlation Between Oxygen Vacancies and Reliability Characteristics in a Single Zirconium Oxide Metal-Insulator-Metal Capacitor", IEEE Transactions on Elctron Devices, , Aug. 2014, pp. 2619-2627, vol. 61, No. 8.
(Continued)

*Primary Examiner* — Moin M Rahman
(74) *Attorney, Agent, or Firm* — Tutunjian & Bitetto, P.C.; Vazken Alexanian

(57) ABSTRACT

A tri-layer dielectric stack is provided for a metal-insulator-metal capacitor (MIMCAP). Also, a metal-insulator-metal capacitor (MIMCAP) is provided having three or more electrodes. The tri-layer dielectric stack includes a first layer formed from a first metal oxide electrical insulator. The tri-layer dielectric stack further includes a second layer, disposed over the first layer, formed from $ZrO_2$. The tri-layer dielectric stack also includes a third layer, disposed over the second layer, formed from a second metal oxide electrical insulator.

16 Claims, 4 Drawing Sheets

(51) Int. Cl.
*H01L 21/02* (2006.01)
*H01L 21/3205* (2006.01)

(56) References Cited

U.S. PATENT DOCUMENTS

| | | | |
|---|---|---|---|
| 9,178,008 B2 | 11/2015 | Chen et al. | |
| 9,257,497 B2 | 2/2016 | Chang et al. | |
| 9,368,392 B2 | 6/2016 | Tseng et al. | |
| 9,443,922 B2 | 9/2016 | Kobrinsky et al. | |
| 2007/0102742 A1* | 5/2007 | Kil | H01L 21/02178 257/295 |
| 2008/0081409 A1 | 4/2008 | Song et al. | |
| 2009/0256259 A1 | 10/2009 | Kanaya | |
| 2015/0221718 A1* | 8/2015 | Rhie | H01L 28/90 257/534 |
| 2016/0071920 A1 | 3/2016 | Wang et al. | |
| 2016/0133691 A1* | 5/2016 | Phatak | H01L 28/75 257/532 |
| 2016/0260373 A1 | 9/2016 | Miyake | |

FOREIGN PATENT DOCUMENTS

| | | |
|---|---|---|
| KR | 2005-0122634 | 12/2005 |
| KR | 10-2006-0052474 | 5/2006 |

OTHER PUBLICATIONS

Kil, et al., "Development of New TiN/ZrO2/Al2O3/ZrO2/TiN Capacitors Extendable to 45 nm Generation", DRAMs Replacing HfO2 based Dielectrics, IEEE, 2006 Symposium on VLSI Technology Digest of Technical Papers, Jun. 2006, 2, pages.
List of IBM Patents or Patent Applications Treated as Related dated Sep. 15, 2017, 2 pages.
U.S. Office Action issued in U.S. Appl. No. 15/706,047 dated Feb. 21, 2019, 17 pages.

* cited by examiner

US 10,290,700 B2

MULTILAYER DIELECTRIC FOR METAL-INSULATOR-METAL CAPACITOR (MIMCAP) CAPACITANCE AND LEAKAGE IMPROVEMENT

BACKGROUND

Technical Field

The present invention relates generally to capacitors and, in particular, to a multilayer dielectric for metal-insulator-metal capacitor (MIMCAP) capacitance and leakage improvement.

Description of the Related Art

Stacked capacitors (>2 electrodes) with Metal/Insulator (High-k)/Metal stacks have been proposed. In order to obtain sufficiently high capacitance density per area, 3-D capacitor structures have been employed, in addition to a k-value increase for the High-k insulator.

A three electrode stacked capacitor was implemented in the prior art to address this challenge of capacitance density for decoupling capacitors. However, since the electrical bias polarities are opposite for the bottom capacitor and the top capacitor in the aforementioned three electrode stacked capacitor, the thickness of the high-k material needs to be sufficiently thick to pass reliability specifications for the weaker side. This results in lower capacitance density. Thus, there is a need for improved stacked capacitors.

SUMMARY

According to an aspect of the present invention, a tri-layer dielectric stack is provided for a metal-insulator-metal capacitor (MIMCAP). The tri-layer dielectric stack includes a first layer formed from a first metal oxide electrical insulator. The tri-layer dielectric stack further includes a second layer, disposed over the first layer, formed from $ZrO_2$. The tri-layer dielectric stack also includes a third layer, disposed over the second layer, formed from a second metal oxide electrical insulator.

According to another aspect of the present invention, a method is provided for forming a tri-layer dielectric stack for a metal-insulator-metal capacitor (MIMCAP). The method includes forming a first layer from a first metal oxide electrical insulator. The method further includes forming, disposed over the first layer, a second layer formed from $ZrO_2$. The method also includes forming, disposed over the second layer, a third layer formed from a second metal oxide electrical insulator.

According to yet another aspect of the present invention, a metal-insulator-metal capacitor (MIMCAP) is provided having three or more electrodes. The metal-insulator-metal capacitor includes two or more tri-layer dielectric stacks. Each of the two or more tri-layer dielectric stacks has a first layer formed from a first metal oxide electrical insulator, a second layer, disposed over the first layer, formed from $ZrO_2$, and a third layer, disposed over the second layer, formed from a second metal oxide electrical insulator. The metal-insulator-metal capacitor further includes a plurality of plates forming at least two plate pairs. Each of the at least two plate pairs has a respective one of the two or more tri-layer dielectric stacks disposed there between. The metal-insulator-metal capacitor also includes three or more electrodes.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a multilayer dielectric stack (hereinafter interchangeably referred to as "multilayer dielectric" in short) for a metal-insulator-metal capacitor (MIMCAP). The multilayer dielectric advantageously provides capacitance and leakage improvement in a MIMCAP.

In an embodiment, a tri-layer stack of $Al_2O_3/ZrO_2/Al_2O_3$ is used as a multilayer dielectric in a stacked capacitor (more than 2 electrodes). The tri-layer stack improves capacitance density compared to $Al_2O_3/HfO_2/Al_2O_3$, thus enabling high-k thickness scaling. That is, the use of ZrO2 in the tri-layer stack contributes to an improved dielectric constant (e.g., k≈30-40) within the tri-layer stack as compared to the dielectric constant of $HfO_2$ (k≈20), due to the formation of a higher k phase when deposited on Al2O3 compared to the lower k phase of $HfO_2$. While $Al_2O_3$ is used in the aforementioned tri-layer stack, in other embodiments, other oxides and/or nitrides and/or oxynitrides can be used in place of $Al_2O_3$, while maintaining the spirit of the present invention.

In an embodiment, a tri-layer layer stack of $Al_2O_3/ZrO_2/Al_2O_3$ is used as a as a multilayer dielectric in 2-plate MIMCAP.

The present invention can be used for applications including, but not limited to, for example, an embedded DRAM capacitor, a decoupling capacitor, Back End Of Line applications, and so forth.

As used herein, a "DRAM" refers to a memory device wherein a basic cell is provided with a selection transistor and a capacitor. A gate of the selection transistor is connected to a word line, a drain thereof is connected to a bit line, and a source thereof is connected to an electrode or the capacitor. A gate of the selection transistor is connected to a word line, a drain thereof is connected to a bit line, and a source thereof is connected to an electrode or the capacitor that is, to an earthed electrode.

As used herein, the term "capacitor" denotes a structure including one or more pairs of electrically conductive materials separated and insulated from each other by a multilayer dielectric for storing a charge. The present invention specifically applies to the multilayer dielectric in a metalinsulator-metal capacitor (MIMCAP). In an embodiment, the MIMCAP includes three or more electrodes.

As used herein, the term "electrode" denotes a component of a capacitor representing one of at least two electrically conductive materials of the capacitor that are separated by a multilayer dielectric in accordance with the present invention.

As used herein, the term "dielectric" denotes a non-metallic material having a room temperature conductivity of less than about 10-10(–m)–1.

As used herein, the term "high-k" denotes a material having a dielectric constant (k) that is greater than the dielectric constant of silicon oxide ($SiO_2$) at room temperature (20° C.-25° C.) and atmospheric pressure (1 atm).

Figure 1:
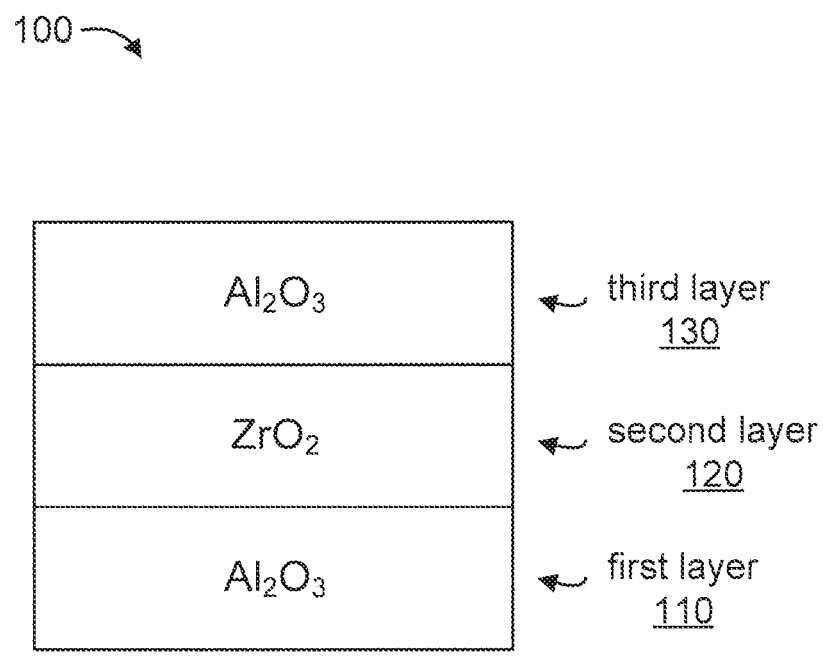
FIG. 1 shows a block diagram for an exemplary multilayer dielectric stack for a metal-insulator-metal capacitor (MIMCAP), in accordance with an embodiment of the present invention.

FIG. 1 shows a block diagram for an exemplary multi-layer dielectric stack 100 for a metal-insulator-metal capacitor (MIMCAP), in accordance with an embodiment of the present invention. It is to be appreciated that the elements of stack 100 are not shown drawn to scale, for the sakes of illustration and clarity.

The multilayer dielectric stack (hereinafter "multilayer dielectric" in short) 100 includes a first layer 110, a second layer 120, and a third layer 130. The first layer 110 is formed of $Al_2O_3$. The second layer 120 is formed of $ZrO_2$. The third layer 130 is formed of $Al_2O_3$.

The layers 110, 120, and 130 can be formed using any known or yet to be invented layer forming techniques including, but not limited to, spinning from solution, spraying from solution, atomic layer deposition (ALD), chemical vapor deposition (CVD), plasma enhanced CVD (PECVD), sputter deposition, reactive sputter deposition, ion-beam deposition, and evaporation.

Figure 2:
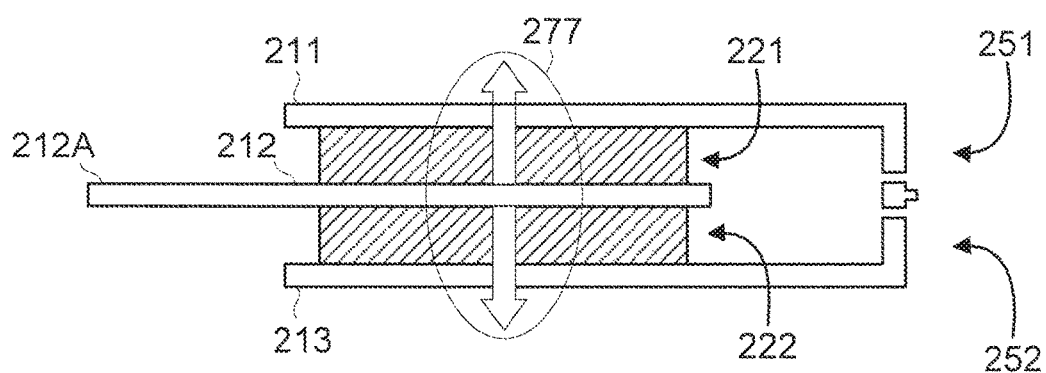
FIG. 2 shows a schematic diagram for an exemplary metal-insulator-metal capacitor (MIMCAP), in accordance with an embodiment of the present invention.

FIG. 2 shows a schematic diagram for an exemplary metal-insulator-metal capacitor (MIMCAP) 200, in accordance with an embodiment of the present invention. It is to be appreciated that the elements of MIMCAP 200 are not shown drawn to scale, for the sakes of illustration and clarity.

The MIMCAP 200 includes a first plate 211, a multilayer dielectric stack 221, a second plate 212, a multilayer dielectric stack 222, and a third plate 213. The second plate 212 is connected to an electrode 212A. The first plate 211 is connected to another electrode (not shown), and the third plate 213 is connected to yet another electrode (not shown). Each of the multilayer dielectric stack 221 and the multilayer dielectric stack 222 can be implemented by, e.g., the multilayer dielectric 100 of FIG. 1.

The first plate 211, the multilayer dielectric stack 221, and the second plate 212 form a first capacitor 251, while the second plate 212, the multilayer dielectric stack 222, and the third plate 213 form a second capacitor 252. The electrical bias polarities 277 are opposing for the first capacitor 251 and the second capacitor 252. However, the use of $ZrO_2$ contributes to (i) an improved dielectric constant within the stacks 221 and 222 and (ii) an improved capacitance density (compared to, e.g., $Al_2O_3/HfO_2/Al_2O_3$), thus enabling high-K thickness scaling.

Figure 3:
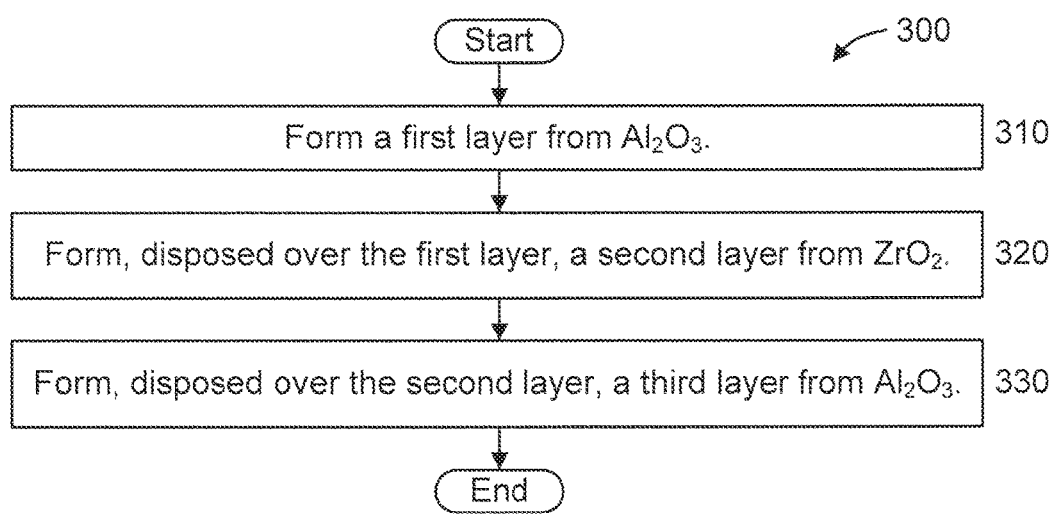
FIG. 3 shows an exemplary method for forming a multilayer dielectric stack for a metal-insulator-metal capacitor stack, in accordance with an embodiment of the present invention.

FIG. 3 shows an exemplary method 300 for forming a multilayer dielectric stack for a metal-insulator-metal capacitor stack, in accordance with an embodiment of the present invention.

At step 310, form a first layer from $Al_2O_3$. Of course, other electrical insulating compounds can be used for the first layer, while maintaining the spirit of the present invention.

At step 320, form, disposed over the first layer, a second layer from $ZrO_2$.

At step 330, form, disposed over the second layer, a third layer from $Al_2O_3$. Of course, other electrical insulating compounds can be used for the third layer, while maintaining the spirit of the present invention.

Figure 4:
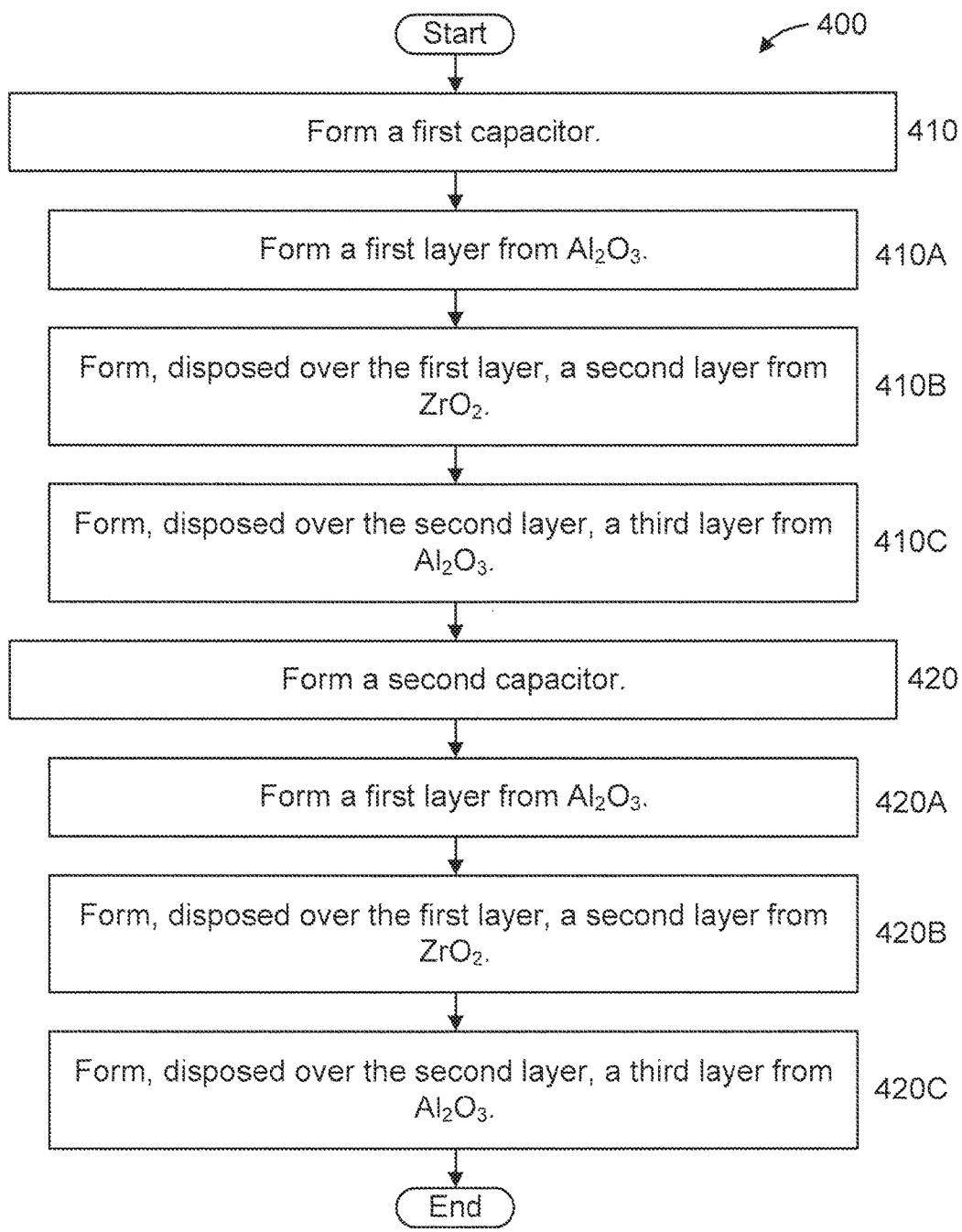
FIG. 4 shows an exemplary method for forming a metal-insulator-metal capacitor (MIMCAP), in accordance with an embodiment of the present invention.

FIG. 4 shows an exemplary method 400 for forming a metal-insulator-metal capacitor (MIMCAP), in accordance with an embodiment of the present invention.

At step 410, form a first capacitor.

In an embodiment, step 410 includes steps 410A-410C relating to the formation of a tri-layer dielectric stack (for the first capacitor) in accordance with an embodiment of the present invention.

At step 410A, form a first layer from $Al_2O_3$. Of course, other electrical insulating compounds can be used for the first layer, while maintaining the spirit of the present invention.

At step 420B, form, disposed over the first layer, a second layer from $ZrO_2$.

At step 430C, form, disposed over the second layer, a third layer from $Al_2O_3$. Of course, other electrical insulating compounds can be used for the third layer, while maintaining the spirit of the present invention.

At step 420, form, disposed over the first capacitor, a second capacitor.

In an embodiment, step 420 includes steps 410A-410C relating to the formation of a tri-layer dielectric stack (for the second capacitor) in accordance with an embodiment of the present invention.

At step 410A, form a first layer from $Al_2O_3$. Of course, other compounds can be used for the first layer, while maintaining the spirit of the present invention.

At step 420B, form, disposed over the first layer, a second layer from $ZrO_2$.

At step 430C, form, disposed over the second layer, a third layer from $Al_2O_3$. Of course, other compounds can be used for the third layer, while maintaining the spirit of the present invention.

In an embodiment, the first capacitor and the second capacitor can share at least one plate. It is to be appreciated that not every aspect of forming a MIMCAP is shown in FIG. 4 for the sake of brevity, as FIG. 4 is primarily directed to the formation of tri-layer dielectric stacks in a MIMCAP (as described with respect to steps 410A-C and 420A-C).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of an apparatus and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A metal-insulator-metal capacitor (MIMCAP) having three or more electrodes, the metal-insulator-metal capacitor comprising:
   two or more tri-layer dielectric stacks, each having
   a first layer formed from a first metal oxide electrical insulator,
   a second layer, disposed over the first layer, formed from $ZrO_2$, and
   a third layer, disposed over the second layer, formed from a second metal oxide electrical insulator;
   at least three conductive plates, wherein a first conductive plate is in physical contact with the first layer of a first of the two or more tri-layer stacks, a second conductive plate is in physical contact with the third layer of the first of the two or more tri-layer stacks and a first layer of a second of the two or more tri-layer stacks, and a third conductive plate is in physical contact with the third layer of the second of the two or more tri-layer stacks; and
   three or more electrodes, wherein a first electrode is electrically connected to the first conductive plate, a second electrode is electrically connected to the second conductive plate, and a third electrode is electrically connected to the third conductive plate.

2. The metal-insulator-metal capacitor of claim 1, wherein the first metal oxide electrical insulator and the second metal oxide electrical insulator is $Al_2O_3$.

3. The metal-insulator-metal capacitor of claim 1, wherein the first metal oxide electrical insulator is different than the second metal oxide electrical insulator.

4. The metal-insulator-metal capacitor of claim 1, wherein the first metal oxide electrical insulator and the second metal oxide electrical insulator are identical to provide symmetrical electrical properties.

5. The metal-insulator-metal capacitor of claim 1, wherein the metal-insulator-metal capacitor is configured as an embedded dynamic random access memory capacitor.

6. The metal-insulator-metal capacitor of claim 1, wherein the metal-insulator-metal capacitor is configured as decoupling capacitor in an electrical circuit.

7. The metal-insulator-metal capacitor of claim 1, wherein the metal-insulator-metal capacitor is formed during a Back End of Line portion in an integrated circuit formation process.

8. A metal-insulator-metal capacitor (MIMCAP) having three or more electrodes with a tri-layer dielectric stack between each pair of adjacent electrodes, the metal-insulator-metal capacitor comprising:
    a first metal oxide electrical insulator layer on a first plate of the metal-insulator-metal capacitor;
    a first zirconium oxide (ZrO2) layer on the first metal oxide electrical insulator layer;
    a second metal oxide electrical insulator layer on the first zirconium oxide (ZrO2) layer;
    a second plate of the metal-insulator-metal capacitor on the second metal oxide electrical insulator layer;
    a third metal oxide electrical insulator layer on the second plate of the metal-insulator-metal capacitor;
    a second zirconium oxide (ZrO2) layer on the third metal oxide electrical insulator layer;
    a fourth metal oxide electrical insulator layer on the second zirconium oxide (ZrO2) layer; and
    a third plate of the metal-insulator-metal capacitor on the fourth metal oxide electrical insulator layer.

9. The metal-insulator-metal capacitor of claim 8, wherein the first metal oxide electrical insulator layer is aluminum oxide ($Al_2O_3$), the second metal oxide electrical insulator layer is $Al_2O_3$, the third metal oxide electrical insulator layer is $Al_2O_3$, and the fourth metal oxide electrical insulator layer is $Al_2O_3$.

10. The metal-insulator-metal capacitor of claim 9, wherein the first, second, third, and fourth metal oxide electrical insulator layers are identical to each other to provide symmetrical electrical properties.

11. The method of claim 8, wherein the first metal oxide electrical insulator layer is a different metal oxide from the second metal oxide electrical insulator layer, and the third metal oxide electrical insulator layer is a different metal oxide from the fourth metal oxide electrical insulator layer.

12. The metal-insulator-metal capacitor of claim 8, wherein the metal-insulator-metal capacitor is configured as an embedded dynamic random access memory capacitor.

13. The metal-insulator-metal capacitor of claim 8, wherein the metal-insulator-metal capacitor is configured as decoupling capacitor in an electrical circuit.

14. A metal-insulator-metal capacitor (MIMCAP) having three or more electrodes with a tri-layer dielectric stack between each pair of adjacent electrodes, the metal-insulator-metal capacitor comprising:
    a first aluminum oxide ($Al_2O_3$) layer on a first plate of the metal-insulator-metal capacitor;
    a first zirconium oxide (ZrO2) layer on the first aluminum oxide ($Al_2O_3$) layer;
    a first aluminum oxide ($Al_2O_3$) layer on the first zirconium oxide (ZrO2) layer;
    a second plate of the metal-insulator-metal capacitor on the second aluminum oxide ($Al_2O_3$) layer;
    a third $Al_2O_3$ layer on the second plate of the metal-insulator-metal capacitor;
    a second zirconium oxide (ZrO2) layer on the third $Al_2O_3$ layer;
    a fourth $Al_2O_3$ layer on the second zirconium oxide (ZrO2) layer; and
    a third plate of the metal-insulator-metal capacitor on the fourth $Al_2O_3$ layer.

15. The metal-insulator-metal capacitor of claim 14, wherein the metal-insulator-metal capacitor is configured as an embedded dynamic random access memory capacitor.

16. The metal-insulator-metal capacitor of claim 14, wherein the metal-insulator-metal capacitor is configured as decoupling capacitor in an electrical circuit.

* * * * *